United States Patent [19]

Ozawa

[11] Patent Number: 4,549,088
[45] Date of Patent: Oct. 22, 1985

[54] ORIGINAL READING DEVICE

[75] Inventor: Takashi Ozawa, Kanagawa, Japan

[73] Assignee: Fuji Xerox Co., Ltd., Tokyo, Japan

[21] Appl. No.: 459,022

[22] Filed: Jan. 18, 1983

[30] Foreign Application Priority Data

Jan. 29, 1982 [JP] Japan .................................. 57-13123

[51] Int. Cl.$^4$ ............................................. H01J 40/14
[52] U.S. Cl. ...................................... 250/578; 358/213
[58] Field of Search ................ 250/211 R, 211 J, 578; 357/31, 32, 10, 24 LR; 358/212, 213

[56] References Cited

U.S. PATENT DOCUMENTS

| | | | |
|---|---|---|---|
| 4,291,337 | 9/1981 | Takamura et al. | 357/24 LR |
| 4,354,104 | 10/1982 | Chikamura et al. | 250/578 |
| 4,388,532 | 6/1983 | Garcia | 250/578 |
| 4,462,047 | 7/1984 | Fujimoto et al. | 358/212 |

Primary Examiner—David C. Nelms
Attorney, Agent, or Firm—Sughrue, Mion, Zinn, Macpeak, and Seas

[57] ABSTRACT

An original reading device including a light-receiving element composed of a substrate having in sequence a plurality of underlying electrodes, a photoconductor and a transparent conductive overlying electrode. A signal from the light-receiving element is read by applying a bias voltage to one of the two electrodes and switching the other electrode with an MOS transistor. The potential of the substrate of the MOS transistor is made equal to or lower than a potential corresponding to the negative value of the bias voltage if the MOS transistor is an n-channel MOS transistor, and the substrate potential is made equal to or higher than a potential corresponding to the positive value of the bias voltage if the MOS transistor is a p-channel MOS transistor.

10 Claims, 14 Drawing Figures

ORIGINAL READING DEVICE

BACKGROUND OF THE INVENTION

The present invention relates to a document or image reading device for use in a facsimile system or other optical equipment. More particularly, the invention relates to improvements in a large-scale image sensor that has recently been developed as a replacement for an MOS photodiode array or CCD image sensor currently used in document or image reading devices.

A large-scale image sensor of the general type to which the invention pertains is composed of an insulating substrate, a plurality of photoelectric transducers formed on the substrate, and a circuit for switching and scanning the transducers which is either formed on the substrate or attached to an adjacent substrate, with the length of the transducer array being equal to the size of the document or image. The sensor uses an optical fiber array or lens array to read the original employing an image formation ratio of 1:1. With this arrangement, the length of optical path needed for image formation can be decreased to significantly reduce the size of the reading device.

The construction of the conventional large-scale image sensor is shown in FIGS. 1A–1C. In FIG. 1A, reference numeral 1 indicates a photoelectric transducer formed of a thin photo-conductive film, the equivalent circuit of which is a photodiode PD and a capacitor CD. Reference numeral 5 designates an array of MOS transistors for switching the transducer, 6 a shift register for scanning the MOS transistor array, 8 a signal line, 9 a load resistor, and 10 a bias supply.

FIG. 1B is a plan view showing a specific integrated circuit implementation of the transducer of FIG. 1A, and FIG. 1C is a cross-sectional view of FIG. 1B taken along a line A—A'. The photoelectric transducer 1 is constructed with a substrate 11 supporting a thin photo-conductive film 3 sandwiched between discrete electrodes 2 made of a thin conductive film and a continuous electrode 4 made of a thin transparent conductive film. A switching circuit 7, in the form of an IC chip which includes the MOS transistor 5 and the shift register 6 fabricated on a semiconductor substrate, is mounted on the substrate 11 and connected to the photoelectric transducer by wire bounding or other suitable means.

When the image of the original is formed on the transducer 1 by an optical system (not shown), a photo-current that varies with the luminous intensity is produced on the various photodiodes PD. The resulting change in the potential of the electrode 2 is transmitted over the signal line 8 by sequentially closing the corresponding MOS transistors 5 to thus develop an output video signal across the resistor 9.

FIG. 2 is a schematic diagram of the sensor for one picture element. The n-channel MOS transistor generally indicated at 5 is formed on a p-type silicon substrate 12 and includes n-impurity diffused areas 13 and 14, a gate 15, a drain 16, and a source 17. The drain 16 is connected to a discrete electrode on the photoelectric transducer 1 via the thin amorphous silicon film 3. The transparent electrode 4 is negatively biased with a bias supply 10. The source 17 is grounded through a signal line 8 and a load resistor 9. The substrate 12 is grounded (as is usually the case when an n-channel MOS transistor is operated).

The operation of the circuit of FIG. 2 will now be described with reference to the equivalent circuit thereof shown in FIG. 3. A constant current source 19 corresponds to the photoelectric transducer 1 of FIG. 2. A capacitance 20 and a diode 21 are formed at the interface between the substrate 12 and the impurity diffused area 13. While the n-channel MOS transistor 5 is off, a photo-current Ip flows from the current source 19 upon illumination of the film 3 with light, whereupon a signal charge accumulates on the capacitance 20. After sufficient time has passed for the charge to accumulate the gate of the MOS transistor 5 is pulsed (by the shift register 6) to turn on the transistor 5 and to discharge the signal charge through the signal line 8 and resistor 9. Signal detection is effected by sensing the resulting discharging current.

In actual operation, as the signal charge accumulates on the capacitance 20, the potential at point A decreases (becoming negative), whereupon the diode 21 becomes biased in the forward direction. If the resulting voltage is larger than the forward voltage drop across the diode 21, the diode conducts. As a result, the accumulated signal charge is discharged through the diode. Because the potential at point A cannot decrease beyond the forward voltage drop of the diode, only a small discharging current can flow when the MOS transistor is turned on. This results in insufficient signal detection. Consequently, only a small output signal is produced upon illumination, which output signal is not linear with respect to luminous intensity and is easily saturated. A large-scale image sensor having these characteristics has a low sensitivity and low dynamic range, and is far from being efficacious in many practical applications.

SUMMARY OF THE INVENTION

Accordingly, an object of the present invention is to provide a large-scale image sensor that is free from the above defects of the conventional device, and which has a high sensitivity and wide dynamic range.

Another object of the invention is to provide a high-performance original reading device that uses such a large-scale image sensor.

In accordance with these and other objects, a reading device of the present invention employs a photoelectric transducer in which a bias voltage applied to one of the two electrodes of the photoelectric transducer and the other electrode is switched on and off by an MOS transistor. The invention is characterized by maintenance of the potential at the transistor substrate equal to or lower than a potential corresponding to the negative value of the bias voltage if the MOS transistor is an n-channel MOS transistor, and maintenance of the substrate potential equal to or higher than a potential corresponding to the positive value of the bias voltage if the MOS transistor is a p-channel MOS transistor.

DESCRIPTION OF THE PREFERRED EMBODIMENTS

Details of the present invention are hereunder first described with reference to the embodiments shown in FIGS. 4A to 8B.

Figure 1A:
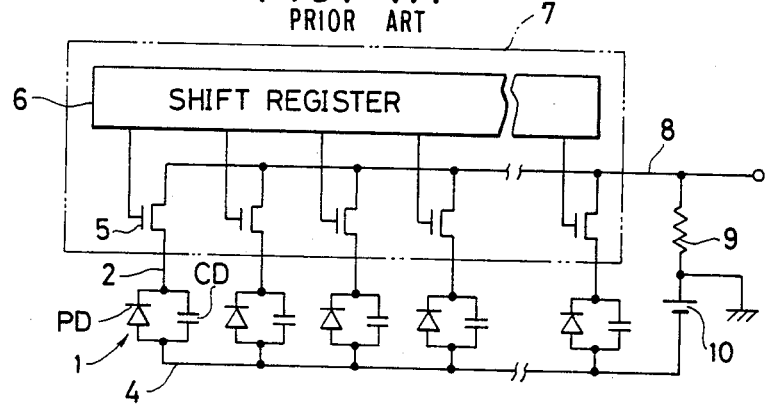
FIG. 1A is an equivalent circuit diagram of a conventional large-scale image sensor.
Figure 1B:
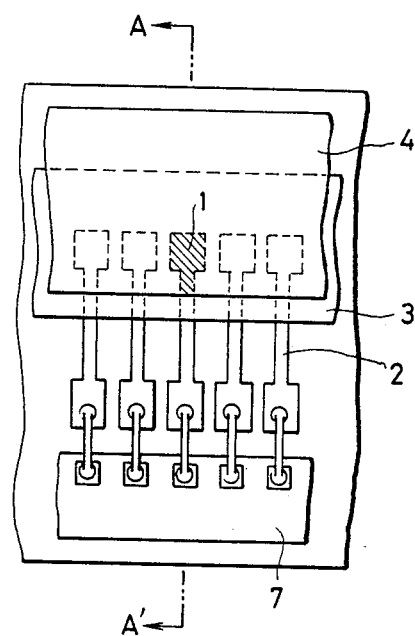
FIG. 1B is a plan view showing the construction of the image sensor of FIG. 1A.
Figure 1C:
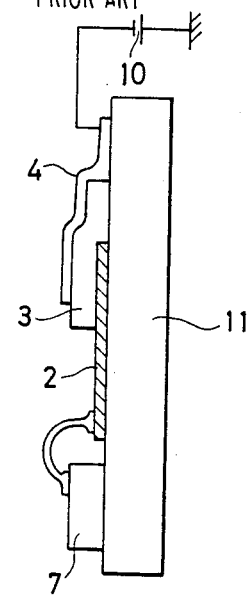
FIG. 1C is a cross-sectional view of the sensor of FIG. 1B taken along a line A—A' in FIG. 1B.
Figure 2:
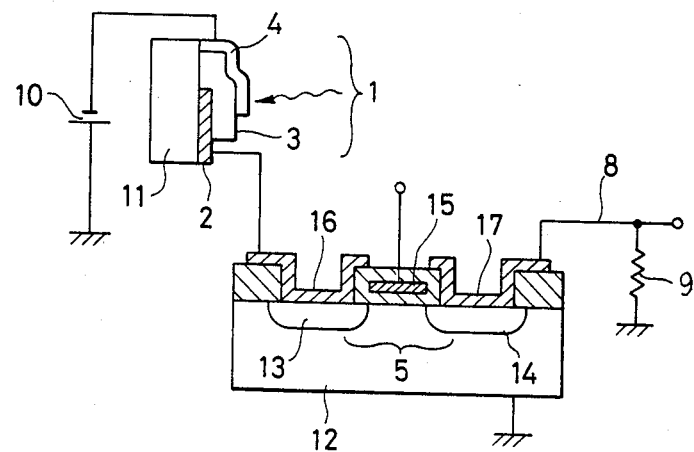
FIG. 2 is a connection diagram used for illustrating a conventional method of operating a large-scale image sensor.
Figure 3:
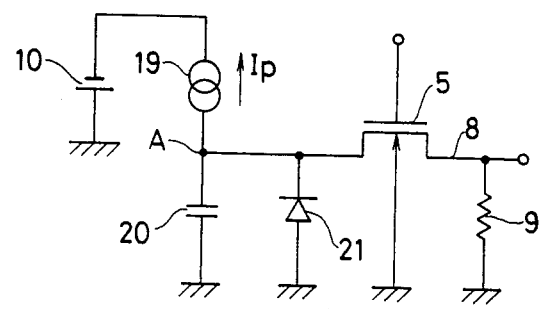
FIG. 3 is an equivalent circuit of the arrangement of FIG. 2.
Figure 4A:
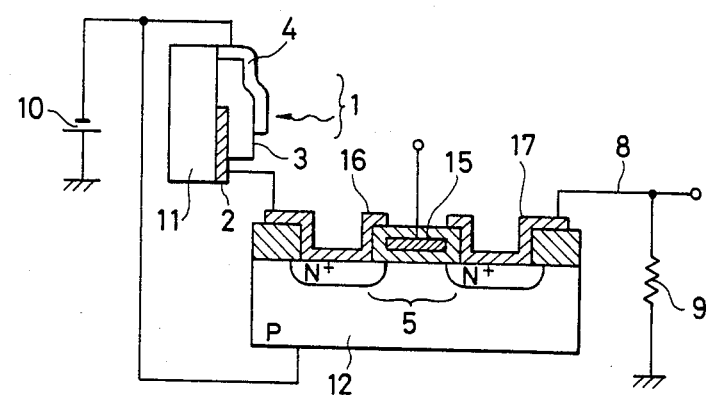
FIGS. 4A and 4B are, respectively, a connection diagram and an equivalent circuit diagram of a large-scale image sensor according to a first preferred embodiment of the present invention.
Figure 4B:
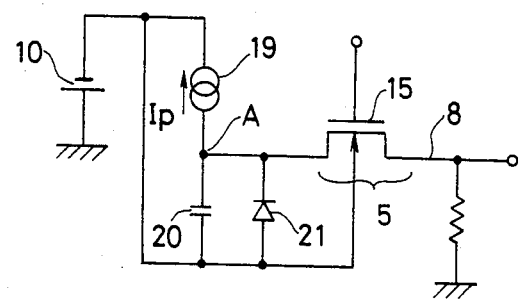

The photoelectric transducer 1 of FIG. 4A includes, in sequence, a glass substrate 11, a discrete Cr electrode 2, a thin amorphous silicon photo-conductive film 3; and a thin transparent ITO conductive film 4. The transducer 1 has a voltage versus current characteristic curve similar to that of a diode, with the Cr electrode being the cathode. FIGS. 4A and 4B are a connection diagram and an equivalent circuit diagram for an embodiment in which the transducer 1 is driven by an n-channel MOS transistor.

The transducer is connected to a bias supply 10 in such a manner that the transparent electrode is at a negative potential. With the substrate 12 of the n-channel MOS transistor connected to the bias source 10 such that the substrate potential is equal to the negative potential of the bias source, the following advantageous effects result. When the potential at the gate 15 is made equal to the negative potential of the bias 10 and the n-channel MOS transistor 5 is turned off, a photo-current Ip flows, upon illumination with light, from a constant-current source 19 in the direction indicated by an arrow in FIG. 4B. As a result, a signal charge accumulates on a capacitance 20. At the same time, the potential at point A decreases. However, since the anode of the diode 21 is connected to the negative electrode of the bias supply 10, the diode 21 is not forward-biased, even if the potential at point A shifts in the negative direction. This enables the capacitance 20 to accumulate charge until the potential at point A becomes equal to that of the negative electrode of the bias supply 10. As a consequence, a high amplitude output signal is produced upon grounding the gate 15 and turning the MOS transistor 5 on. Moreover, the output is sufficiently linear with respect to luminous intensity. Hence, a large-scale image sensor having a high sensitivity and wide dynamic range can be constructed using the teachings of the invention.

Figure 5A:
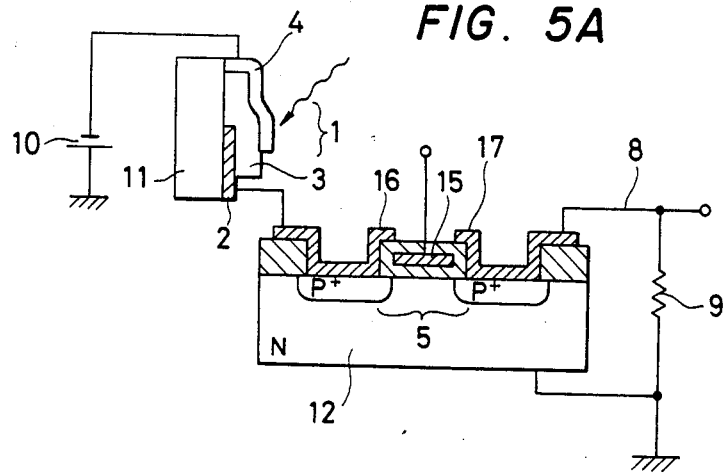
FIGS. 5A and 5B are, respectively a connection diagram and an equivalent circuit diagram of a large-scale image sensor according to a second preferred embodiment of the present invention.
Figure 5B:
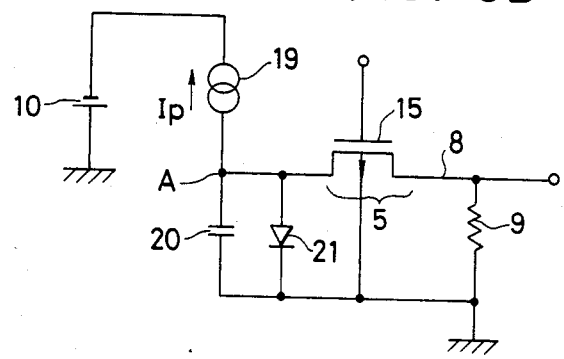

FIGS. 5A and 5B are a connection diagram and an equivalent circuit diagram, respectively, for an embodiment in which the transducer 1 is driven by a p-channel MOS transistor. As in the case of FIG. 4, the transducer 1 is connected to the bias supply 10 in such a manner that the transparent electrode 4 is at a negative potential, but the potential of the substrate 12 is made equal to the positive potential of the bias source 10. In the illustrated embodiment, the substrate is connected to ground. By using this arrangement, the following advantageous results are obtained. By setting the potential at the gate 15 at ground potential, when the MOS transistor 5 is off, a photo-current Ip source flow, upon illumination with light, from the constant-current source 19 in the direction indicated by an arrow in FIG. 5B. As a result, a signal charge accumulates on a capacitance 20. Then, the potential at point A decreases, but since the diode 21 is reverse biased, sufficient charge accumulation is achieved without leakage. Consequently, a high output signal is produced upon setting the potential of the gate 15 equal to the negative bias and turning the MOS transistor 5 on. High-sensitivity and wide dynamic range characteristics are achieved, as in the case of the embodiment of FIG. 4.

Figure 6:
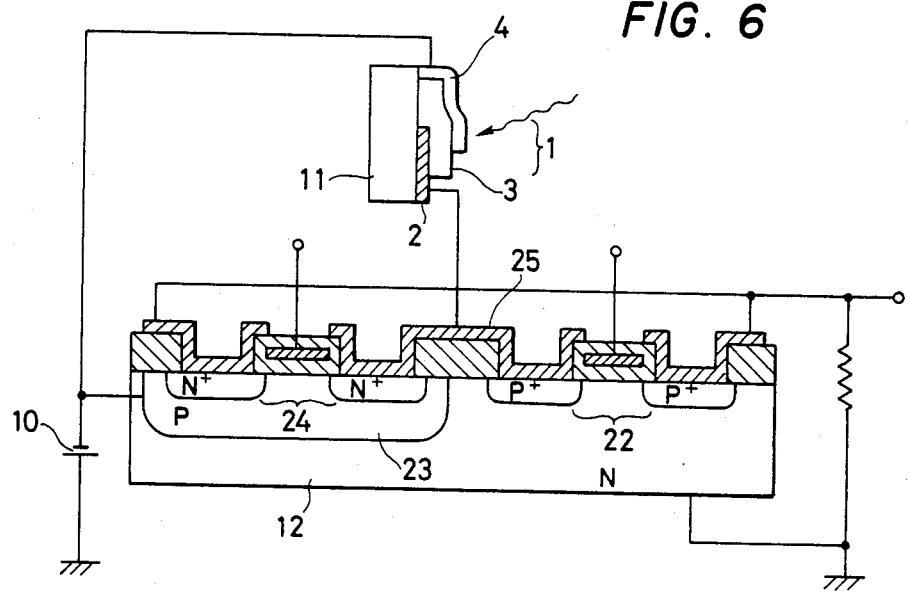
FIG. 6 is a connection diagram of a large-scale image sensor according to a third preferred embodiment of the present invention.

The embodiments of FIGS. 4A, 4B and 5A, 5B assume the use of only one of an n-channel MOS transistor and a p-channel MOS transistor. However, the device may be used simultaneously by employing a CMOS transistor as shown in the connection diagram of FIG. 6. The CMOS transistor of FIG. 6 is made up of a p-channel MOS transistor 22 formed in an n-type silicon substrate 12 and an n-channel MOS transistor 24 fabricated in a p-type well 23 formed in a silicon substrate. A common drain 25 for the two transistors is connected to the electrode 2. By connecting the silicon substrate 12 to a bias supply 10 in the same manner as the p-channel and n-channel MOS transistors are connected to the bias supply 10 in FIGS. 4A, 4B and 5A, 5B there is obtained an output having a high sensitivity and wide dynamic range.

Figure 7A:
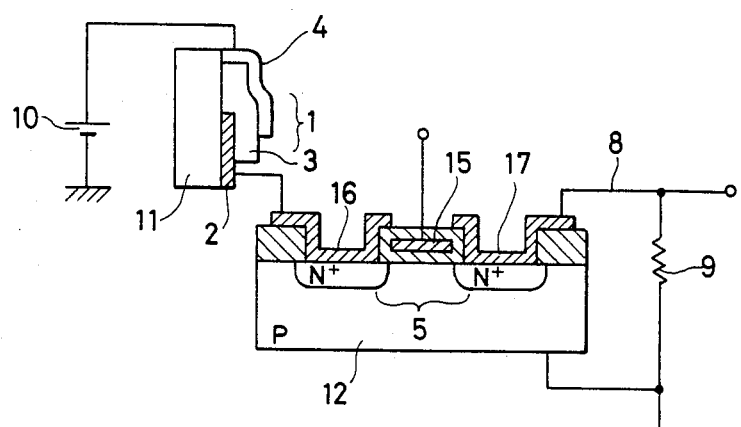
FIGS. 7A and 7B are, respectively, a connection diagram and an equivalent circuit diagram of a large-scale image sensor according to a fourth preferred embodiment of the present invention.
Figure 7B:
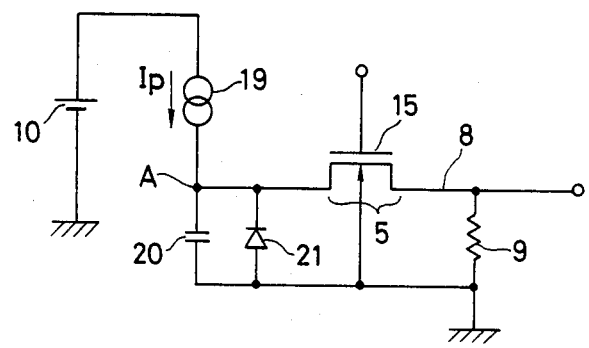

FIGS. 7A and 7B show still another embodiment wherein a thin photo-conductive film made of a Se-As-Te system is used. In this case, the photoelectric transducer 1 of FIG. 7 includes, in sequence, a glass substrate 11, a discrete Au electrode 2 having a Cr undercoating, a thin Se-As-Te film 3, and a thin transparent $SnO_2$ conductive film 4. The transducer 1 has a voltage versus current characteristic curve similar to that of a diode with the thin transparent conductive film 4 being the cathode. FIGS. 7A and 7B are, respectively, a connection diagram and an equivalent circuit diagram for an embodiment in which the transducer 1 is driven by an n-channel MOS trnasistor. The transducer 1 is connected to the bias supply 10 in such a manner that the transparent electrode 4 is positive. Upon illumination, a photo-current Ip flows from a constant current source in the direction indicated by an arrow in FIG. 7B. Due to the subsequent accumulation of a signal charge on the capacitance 20, the potential at point A changes in a positive direction. If the potential of the substrate 12 of the n-channel MOS transistor 5 is equal to the negative potential of the bias source 10 (ground potential), the diode 21 is always reverse biased, and an output having a high-sensitivity and wide dynamic range is obtained.

Figure 8A:
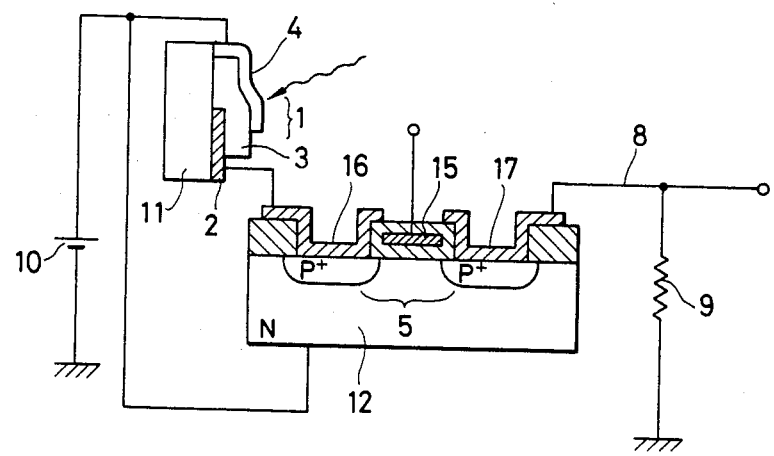
FIGS. 8A and 8B are, respectively, a connection diagram and an equivalent circuit diagram of a large-scale image sensor according to a fifth preferred embodiment of the present invention.
Figure 8B:
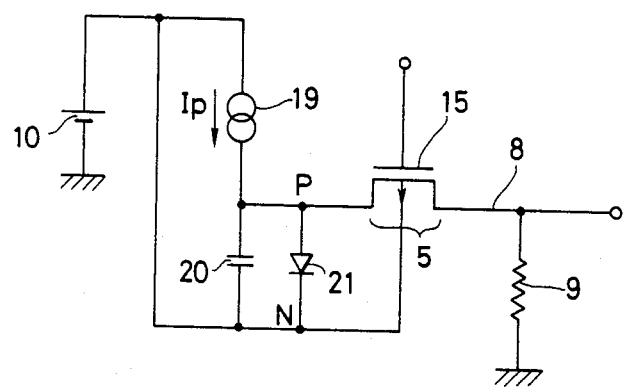

FIGS. 8A and 8B are, respectively, a connection diagram and an equivalent circuit diagram for an embodiment in which the transducer 1 using a thin Se-As-Te film 3 is driven by a p-channel MOS transistor 5. As in the case of FIGS. 5A and 5B, the desired output is produced by maintaining the potential of the substrate 12 of the MOS transistor 5 equal to the positive potential of the bias source 10. Again, the embodiments of FIGS. 7A, 7B and 8A, 8B may be replaced by an embodiment in which the transducer 1 is driven by a CMOS transistor.

In the foregoing embodiments, the thin photo-conductive is made of amorphous silicon of Se-As-Te. However, it is to be understood that the film may be made of other materials such as Se, Se-As, Se-Te, Cd-S, Cd-Se, Zn-Se and Zn-Cd-Te, composite films of these materials, and polycrystalline silicon. The image sensor shown in each embodiment has the thin transparent conductive film 4 as the topmost layer and light is shone upon it from above. Alternatively, the electrode 2 on the substrate may be made of a thin transparent conductive film and the substrate made of a transparent material so as to permit light to enter from behind the substrate.

As described in the foregoing, the present invention provides a large-scale image sensor that produces an output having a high sensitivity and wide dynamic range irrespective of the polarity of the bias voltage and the type of MOS transistor used. In each of the embodiments described, the substrate potential is made equal to the bias potential, but it is to be understood that the substrate potential may be lower than a potential corresponding to the negative value of the bias potential if an n-channel MOS transistor is used, whereas the substrate potential may be made higher than a potential corresponding to the positive value of the bias potential if a p-channel MOS transistor is used.

I claim:

1. In an image sensor including a photoelectric transducer, a biasing voltage source coupled to said photoelectric transducer, and an n-channel MOS transistor formed on a semiconductor substrate with a first terminal of said photoelectric transducer being connected to a drain of said MOS transistor, a capacitor and a diode being formed between said drain and said substrate of said MOS transistor, said MOS transistor being turned on to connect said capacitor to a load connected between a source of said MOS transistor and a ground terminal for detecting an intensity of light from an amount of charge stored on said capacitor, the improvement comprising means for maintaining said substrate during charging of said capacitor at a potential equal to or lower than a negative value of the potential of said biasing voltage source.

2. In an image array sensor including a photoelectric transducer, a biasing voltage source coupled to said photoelectric transducer, and a p-channel MOS transistor formed on a semiconductor substrate with a first terminal of said photoelectric transducer being connected to a drain of said MOS transducer, a capacitor and a diode being formed between said drain and said substrate of said MOS transistor, said MOS transistor being turned on to connect said capacitor to a load connected between a source of said MOS transistor and a ground terminal for detecting an intensity of light from an amount of charge stored on said capacitor, the improvement comprising means for maintaining said substrate during charging of said capacitor at a potential equal to or greater than a potential corresponding to a positive value of the potential of said biasing voltage means.

3. In an image sensor including a photoelectric transducer and an MOS transistor formed on a semiconductor substrate with a first terminal of said photoelectric transducer being connected to a drain of said MOS transistor, a capacitor and a diode being formed between said drain and said substrate of said MOS transistor, said capacitor being charged in response to a current produced by said photoelectric transducer when light falls on said photoelectric transducer, and said MOS transistor being turned on to connect said capacitor to a load connected between a source of said MOS transistor and a ground terminal for detecting an intensity of said light from an amount of charge stored on said capacitor, the improvement comprising means for reverse biasing said diode while said capacitor is charging.

4. The image sensor of claim 3, wherein said MOS transistor is an n-channel device, and wherein said reverse biasing means comprises a voltage source having a positive terminal connected to said ground terminal and a negative terminal connected to a second terminal of said photoelectric transducer and to said substrate.

5. The image sensor of claim 3, wherein said MOS transistor is a p-channel device, and wherein said reverse biasing means comprises a voltage source having a positive terminal connected to said ground terminal and a negative terminal connected to a second terminal of said photoelectric transducer, said substrate of said MOS transistor being connected to said ground terminal.

6. The image sensor of claim 3, wherein said MOS transistor is a CMOS device comprising an n-type substrate connected to said ground terminal, a p-channel MOS transistor formed in said substrate, a p-type well formed in said substrate, and an n-channel MOS transistor formed in said p-type well, said p-channel MOS transistor and said n-channel MOS transistor having a common drain connected to said first terminal of said photoelectric transducer; and wherein said reverse biasing means comprises a voltage source having a positive terminal connected to said ground terminal and a negative terminal connected to said p-type well and a second terminal of said photoelectric transducer.

7. The image sensor of claim 3, wherein said MOS transistor is an n-channel device, and wherein said reverse biasing means comprises a voltage source having a positive terminal connected to a second terminal of said photoelectric transducer and a negative terminal connected to said ground terminal.

8. The image sensor of claim 3, wherein said MOS transistor is a p-channel device, and wherein said reverse biasing means comprises a voltage source having a positive terminal connected to a second terminal of said photoelectric transducer and said substrate and a negative terminal connected to ground.

9. The image sensor of claim 3, wherein said image sensor comprises an array of said photoelectric transducers and MOS transistors; and further comprising shift register means having outputs connected to gates of respective ones of said MOS transistors for pulsing on said MOS transistors in a predetermined sequence.

10. The image sensor of claim 3, said photoelectric transducer being formed on a different substrate from said MOS transistor.

* * * * *